United States Patent
Wu et al.

(10) Patent No.: US 7,692,562 B1
(45) Date of Patent: Apr. 6, 2010

(54) SYSTEM AND METHOD FOR REPRESENTING DIGITAL MEDIA

(75) Inventors: Peng Wu, San Jose, CA (US); Pere Obrador, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 820 days.

(21) Appl. No.: 11/582,754

(22) Filed: Oct. 18, 2006

(51) Int. Cl.
*H03M 5/00* (2006.01)

(52) U.S. Cl. .......................... 341/55; 341/58

(58) Field of Classification Search .......... 341/55
See application file for complete search history.

(56) References Cited

U.S. PATENT DOCUMENTS 7,383,566 B1 * 6/2008 Emura ................... 725/114

FOREIGN PATENT DOCUMENTS

EP       1193899 A1 *  4/2002

* cited by examiner

*Primary Examiner*—Khai M Nguyen

(57) ABSTRACT

A computerized system for representing a digital media using both a bit stream and an associated metadata includes a codec configured to encode the digital media to the bit stream. The codec is further configured to generate a metadata representation stream of the bit stream that encapsulates information embedded in the bit stream and at least one type of media-related information. The system also includes a manager configured to assure synchronization between the bit stream and the metadata representation stream during streaming of the bit stream and the metadata representation stream.

19 Claims, 5 Drawing Sheets

SYSTEM AND METHOD FOR REPRESENTING DIGITAL MEDIA

BACKGROUND

Digital entertainment (DE) applications typically involve relatively extensive interaction between consumers and the media. In DE applications, therefore, media is often captured, edited, managed, rendered, and distributed. An example of a DE application is a video editing application, through which consumers annotate and modify the media. In other words, DE applications differ from traditional playback types of applications because of the level of interactivity provided to the consumers. As such, DE applications typically impact the media by adding a greater level of complexity, which ranges from labeling a certain video frame as a keyframe, but not changing the bit stream itself, to reproduction of the bit stream itself, such as splitting a media into multiple segments.

DE applications often need to access information embedded with media. For instance, a media is often rendered on different output devices, such as, a printer, a television, a high-definition television, and a computer monitor. In order to determine the optimal rendering strategy for each of these output devices, different applications request information pertaining to the media, such as, image aspect ratio and frame rate, at different points in time. As another example, in video editing and reproduction applications, many tasks, such as keyframe extraction, high resolution frame production, and panorama from multiple frames, require motion information among video frames as a required piece of information. As such, the motion information of the media is accessed frequently by the video editing and reproduction applications.

In DE applications, the media itself is often represented in a coded bit stream, such as MPEG-1 or MPEG-2, after being captured. These types of coded bit streams are the main forms of media representation in traditional media playback and media distribution applications, mainly due to certain advantages associated with their compression and transmission. However, in order to achieve the compactness that is required for compression and transmission of the coded bit streams, relatively complex schemes have been adopted to encode the digital media, to thereby generate the coded bit stream with relatively complicated data structures. The relatively complex coding mechanisms and coded bit streams often require sophisticated and complex mechanisms to access the information embedded in the coded bit streams.

Although these conventional methods of bit stream representation of digital media are suitable for general compression and decompression applications, they are inefficient for DE applications due, for instance, to their complex requirements on media objects.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a system and method for representing digital media in a form that may be suited for digital entertainment (DE) applications. More particularly, disclosed herein are a system and method for generating and deploying media representations of digital media objects that use both coded bit streams and their associated metadata in the representations, which may assist developers in the development of the DE applications. In one regard, the associated metadata representations of the coded bit streams may more easily be accessed by the developers as compared with the coded bit streams themselves, which may reduce the overall costs associated with the development of the DE applications.

In addition, the system and method disclosed herein include a means for encapsulating the bit stream and the metadata to thereby assure the two stay synchronized throughout DE applications. In this regard, the bit stream and the metadata may remain synchronized following changes to the bit stream.

Figure 1:
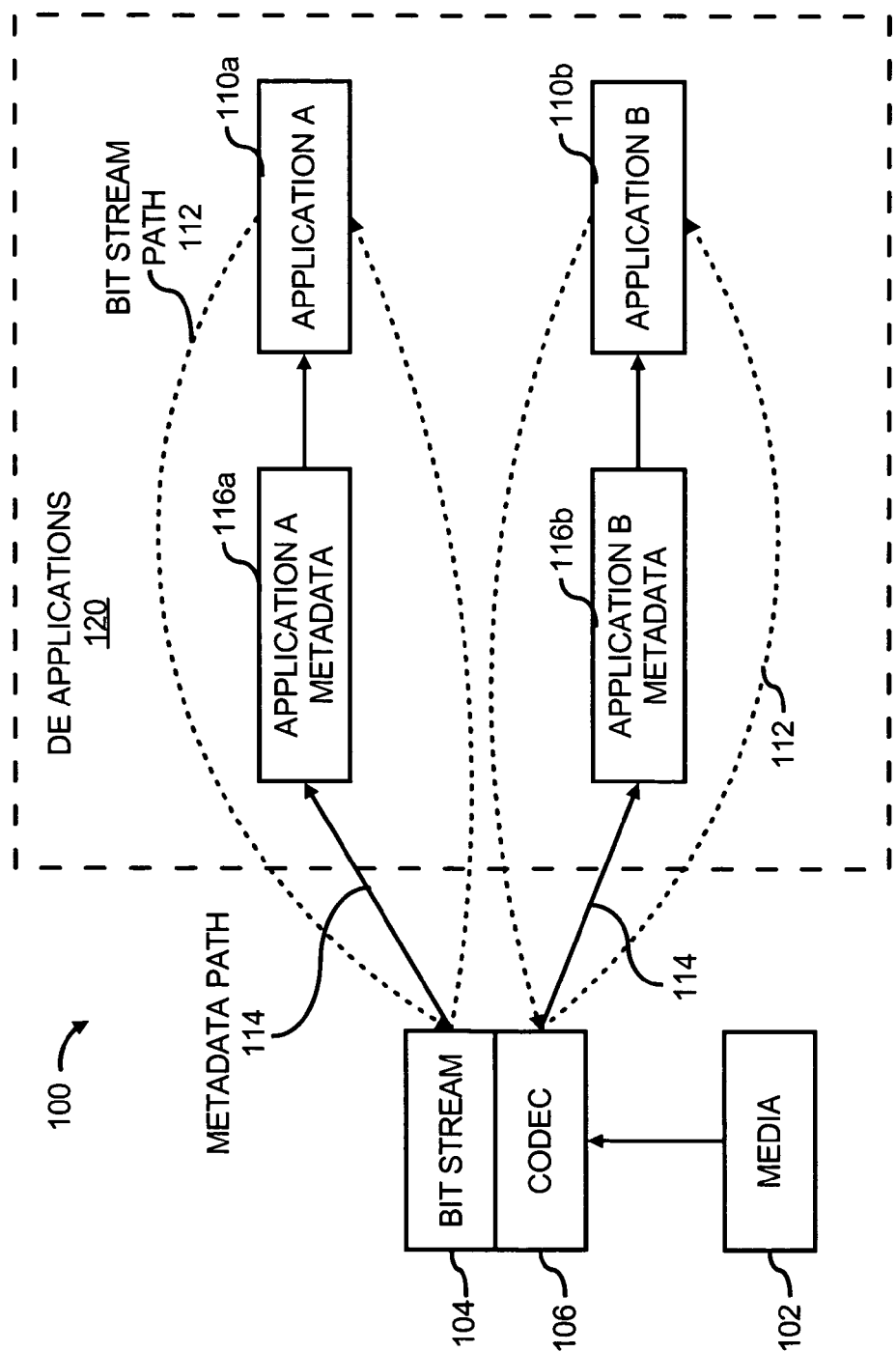
FIG. 1 depicts a block diagram of a conventional framework of how a media is represented and deployed in digital entertainment applications.

With reference first to FIG. 1, there is shown a block diagram of a conventional framework 100 of how a media 102 is represented and deployed in digital entertainment (DE) applications 120. As shown, the coded bit stream 104 is produced by passing the digital media 102 through a codec 106 that is responsible for encoding the digital media 102 to the bit stream 104 and to decode the bit stream 104. In addition, the coded bit stream 104 interacts with one or more DE applications 110a, 110b through one of two possible paths, a bit stream path 112, depicted as dotted arrows, and a metadata path 114 depicted as solid arrows.

When the bit stream 104 interacts with an application 110a, 110b using the bit stream path 112, the application 110a, 110b operates on the bit stream 104 directly. That is, the application 110a, 110b calls the codec functions to probe into the bit stream 104 to retrieve the information needed by the application 110a, 110b. If the application 110a, 110b requires modification of the bit stream 104, such as, splitting the bit stream, merging two bit streams, scaling bit streams, etc., the application 110a, 110b also has to call codec functions to perform these tasks.

A relatively large number of conventional rendering and distribution applications interact through the bit stream path 112. For instance, to print a frame from a video sequence, a printing application extracts the frame pixels from the bit stream 104. As another example, a display device, such as, a television, monitor, PDA, etc., retrieves frames from the bit stream 104 and outputs them to the display device to display a video sequence.

In the metadata path 114, the bit stream 104 is sent to an application metadata extraction module (not shown), which probes into the bit stream 104 to compute the application oriented metadata 116a, 116b. The application 110a, 110b utilizes the metadata to support different media operations. In addition, the application 110a, 110b may also modify the application metadata 116a, 116b. A number of editing applications have adopted the metadata path 114 in their operations. For instance, mpeg-7 has adopted the metadata path 114 in a number of video management applications for describing the media content.

Generally speaking, bit stream 104 representations of digital media 102 are relatively complex and it is thus relatively difficult to know where in the bit stream 104 to find information about the bit stream 104, such as, how the pixels in an image are compressed. Application developers typically require this type of information and are often required to spend great amounts of time in locating needed information from the bit stream 104. One result of this requirement is that application developers often spend a large amount of time in dealing with all of the details at the bit stream level instead of on the application development, which often results in higher application development costs.

Figure 2:
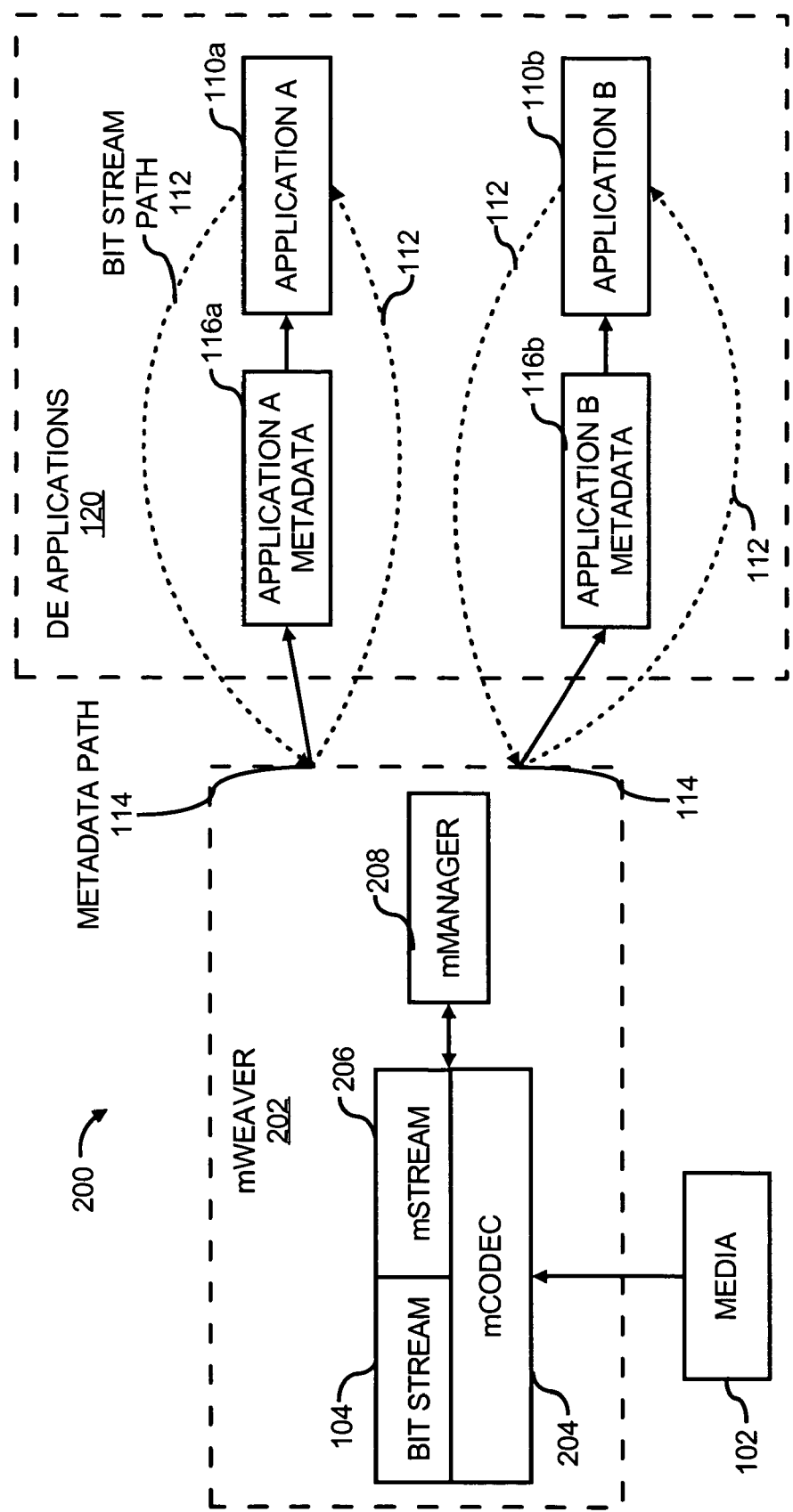
FIG. 2 is a metadata centered media representation and deployment system, in accordance with an embodiment of the invention.

In contrast to the conventional system 100 for encoding and transmitting the bit stream 104, a metadata centered media representation and deployment system 200 is depicted in FIG. 2, according to an example of the invention. Generally speaking, the system 200 may be employed to generate a representation of the bit stream 104 that includes a metadata stream which encapsulates at least one type of media-related information that is useful in DE applications.

Users, such as application developers, may thus obtain the useful information pertaining to the bit stream 104 from the metadata stream. As such, for instance, the users do not have to probe into the bit stream 104 to obtain the useful information because it is contained in the metadata stream. In addition, because information contained in the metadata stream is easier and less costly to access than the bit stream 104, the costs associated with accessing the useful information is substantially reduced over conventional systems.

As shown in FIG. 2, the media representation communicated to one or more DE applications 120 is labeled as "mWeaver" 202, according to an example of the invention. As described in greater detail below, mWeaver 202 generally comprises a representation of the digital media 102 which uses both the coded bit stream 104 and metadata associated with the coded bit stream 104. In one example, the mWeaver 202 may be stored in extensible markup language (XML) to facilitate discovery and access to the data contained therein.

The mWeaver 202, more particularly, is generated by a relatively specialized codec, labeled as "mCodec" 204 in FIG. 2. The mCodec 204 is similar to conventional codecs and is thus configured to encode the digital media 102 to a bit stream 104 and to also decode the bit stream 104. In one regard, therefore, the coded media bit stream 104 may follow the same coding structure of existing bit streams, such as, mpeg-1, mpeg-2, etc. The mCodec 204 differs, however, from conventional codecs because the mCodec 204 is also configured to generate a metadata representation that encapsulates information embedded in the bit stream 104 and at least one type of media-related information. The metadata representation is denoted as "mStream" 206 in FIG. 2.

The media-related information may, more particularly, include information that is known to be useful in or associated with DE applications 120. The information to be presented in the mStream 206 may generally comprise any of a number of different types of information. In one example, the types of information to be presented may be selected according to the frequencies with which the information is typically accessed and retrieved from bit streams. That is, those types of information that are more commonly and frequently accessed may be presented in the mStream 206 over those types of information that are less frequently accessed.

By way of example, one type of information presented in the mStream 206 may include motion information, which is widely used in supporting editing applications, for keyframe extraction, motion intensity descriptor computation, etc. As another example, in scalable transmission, frame-type information may be presented because the bandwidth requirement poses the need to drop a certain number of B-frames, and in mpeg-1 and mpeg-2 bit streams, to satisfy a certain frame rate.

On the other hand, types of information that are rarely found useful, such as, various flag, header information embedded in the bit stream for parsing bits, etc., may be omitted from the mStream 206. As another example, and in certain instances, types of information that are useful in some applications, such as, DCT coefficients of frames, etc., may be omitted from the mStream 206 because the costs associated with presenting and accessing these types of information may reach as high as the costs associated with probing into the bit stream 104 to obtain the information.

In situations where information embedded in the bit stream 104 has not been presented in the mStream 206, the mCodec 204 may probe into the bit stream 104 to access and retrieve that information, should that information be desired.

According to another example, the mStream 206 may encapsulate additional information in addition to the information embedded in the bit stream 104. The additional information may include information that is considered to be unrelated to compression/transmission data, such as, media capture metadata. The media capture metadata may include, for instance, information pertaining to the lighting condition of the captured media, color profile information, etc. The color profile information may be useful, for instance, in rendering the media stream on projectors, printing devices, or the like.

With particular reference back to FIG. 2, the system 200 is further depicted as including an "mManager" 208. As shown therein, the mManager 208 may also be contained in the mWeaver 202 representation and may be streamed, transmitted, or circulated along with the mStream 206 and the bit stream 104 to the DE applications 120. Alternatively, however, a pointer to the mManager 208 may be transmitted with the mStream 206 and the bit stream 104. In any regard, the mManager 208 generally operates to assure synchronization between the bit stream 104 and the mStream 206 because in order for a DE application 120 to access either the mStream 206 or the bit stream 104, the DE application 120 must call the APIs of the mManager 208 as described in greater detail herein below. The mManager 208 therefore assures that the mStream 206 and the bit stream 104 remain synchronized by preventing the DE applications 120 from having direct access to either the bit stream 104 or the mStream 206.

Generally speaking, the mManager 208 responds to requests from the applications 110a, 110b through either the metadata path 114 or the bit stream path 112. The requests from the applications 110a, 110b may be classified into a first category called a "breaking request," which includes requests that require changing of the bit stream 102 and thus the associated metadata representation, mStream 206. The requests may also be classified into a second category called a "retrieving request," which includes requests that require retrieval of embedded metadata information from the mStream 206 and not of the bit stream 104.

In one regard, the mManager 208 generally includes a set of application programming interfaces (APIs) that may be called to respond to the different types of requests. For "retrieving requests", the mManager 208 may call APIs that operate on the mStream 208 only. For "breaking requests," since the mManager 208 may call APIs that instruct the mCodec 204 to produce a new synchronized bit stream 104 and mStream 206. In this case, changes to the bit stream 104 are guaranteed to also be reflected on the new mStream 206.

The mManager 208 may thus support users in developing applications because the mManager 208 automatically synchronizes the bit stream 104 and the mStream 206 as changes to the digital media 102 are made based upon requests by the users. Thus, for instance, if a user wants to break a video down into two segments, the mManager may automatically break down the video, provide the parameters concerning the time stamp, and may also synchronize the two segments. In addition, therefore, because synchronization between segments of the digital media 102 are assured by the mManager 208, users need only call a high level API to instruct the API to perform a desired operation on the digital media 102, such as, splitting the video, combining multiple videos, etc.

Through implementation of the system 200, DE applications 120 may not have direct access to the bit stream 104 and the mStream 206, but instead may call APIs exposed in the mManager 208. In this regard, "breaking requests" sent to the mManager 208 are answered by the mManager 208 by calling the mCodec 204 to generate a new bit stream 104 and mStream 206. This encapsulation by the mCodec 204 generally assures that the bit stream 104 and the mStream 206 stay intact and synchronized. In addition, the encapsulation substantially prevents the bit stream 104 from being wrongfully manipulated.

An additional benefit of encapsulating the bit stream 104 and the mStream 206 as disclosed herein is that a digital media 102 may present itself as a functional object rather than a bit stream in DE applications 120. This is beneficial because in many DE applications 120, handling bit streams is a relatively demanding task and each application often has to deal with the same task of determining how to retrieve information from the bit stream and how to modify the bit stream. Through the encapsulation and the exposure of functionalities through mManager 208, the bit stream 104 operations remain hidden from the DE applications 120, which may greatly simplify the development of the DE applications 120.

Figure 3:
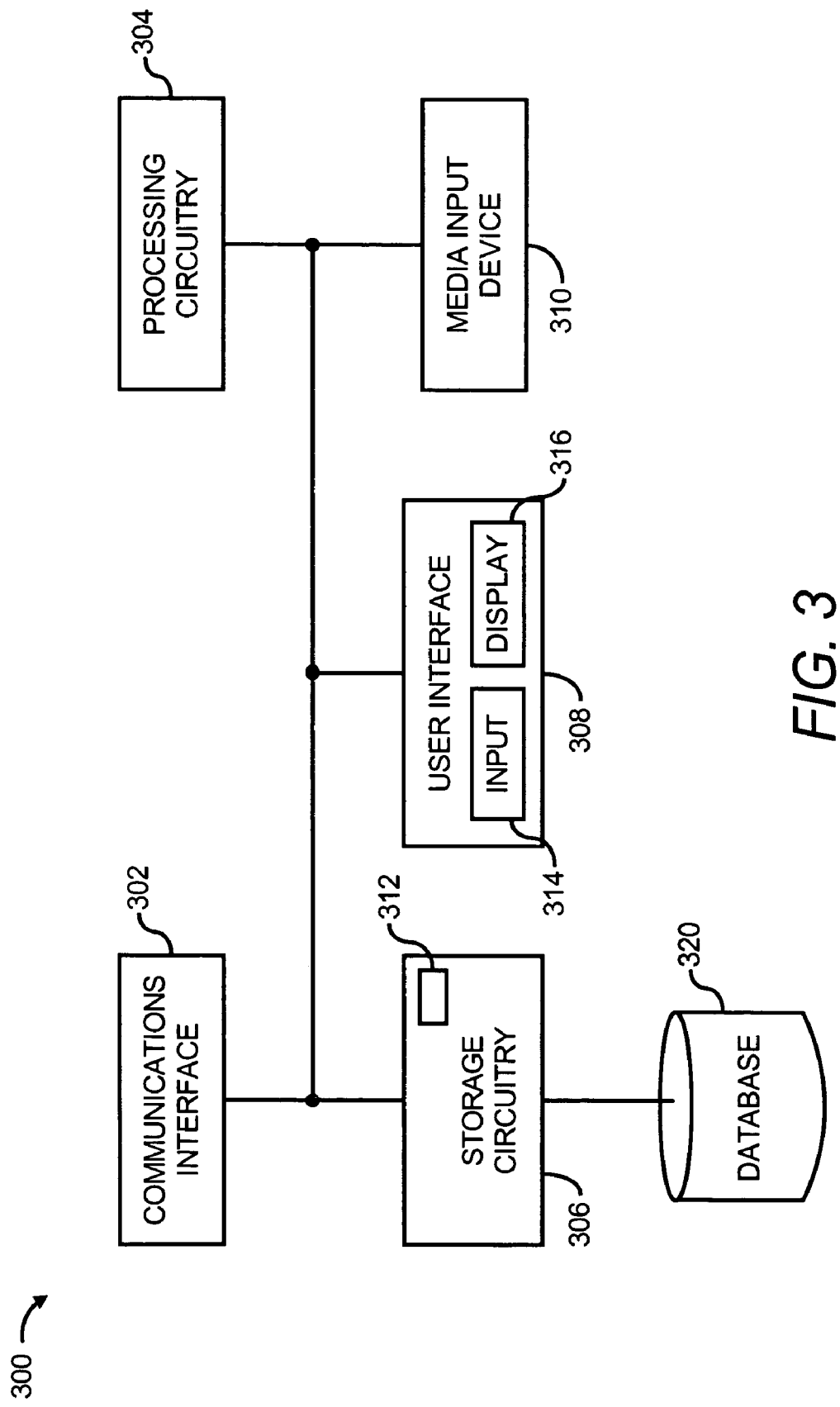
FIG. 3 shows a block diagram of a media management system, which may implement various examples of media representation systems and methods disclosed herein, according to an embodiment of the invention.

According to an example, and as shown in FIG. 3, a media management system 300 may employ various examples of the metadata centered media representation and deployment system 200, according to an example. The media management system 300 is depicted as including a communications interface 302, processing circuitry 304, storage circuitry 306, a user interface 308, a media input device 310, and a database 320. The media management system 300 may include additional components and some of the components described herein may be removed and/or modified without departing from a scope of the media management system 300.

The communications interface 302 is arranged to implement communications of the media management system 300, which may be embodied in a computing device, with respect to external devices, which are not shown. For instance, the communications interface 302 may be arranged to communicate information bi-directionally with respect to another computing device. The communications interface 302 may be implemented as a network interface card (NIC), serial or parallel connection, USB port, Firewire interface, flash memory interface, floppy disk drive, or any other suitable arrangement for communicating with respect to the media management system 300.

In one example, the processing circuitry 304 is arranged to process data, control data access and storage, issue commands, and control other desired operations. The processing circuitry 304 may include circuitry configured to implement desired programming provided by appropriate applications, such as the methods discussed herein below. For instance, the processing circuitry 104 may be implemented as one or more of a processor and other structure configured to execute executable instructions including, for example, software, firmware, and/or hardware circuitry instructions. The processing circuitry 304 may thus include, for instance, hardware logic, PGA, FPGA, ASIC, state machines, or other structures alone or in combination with a processor.

More particularly, for instance, the processing circuitry 304 may execute or otherwise implement the mCodec 206 and the mManager 208 discussed above to represent a media 102 through mWeaver 202. In addition, the code for the mCodec 206 and the mManager 208, as well as additional code used to control the processing circuitry 304, may be stored as part of the processing circuitry 304. In addition, or alternatively, this code may be stored in the storage circuitry 306.

The storage circuitry 306 is configured to store programming such as executable code or instructions (for instance, software, firmware, or both), electronic data, image data, meta data associated with image data, databases, or other digital information and may include processor-usable media. Processor-usable media may be embodied in any computer program product(s) or article of manufacture(s) which may contain, store, or maintain programming, data and/or digital information for use by or in connection with an instruction execution system including the processing circuitry 304. For instance, the processor-usable media may include any one of physical media such as electronic, magnetic, optical, electromagnetic, infrared or semiconductor media. Additional examples of processor-usable media include, for instance, a portable magnetic computer diskette, such as a floppy diskette, zip disk, hard drive, random access memory, read only memory, flash memory, cache memory, and other configurations capable of storing programming, data, or other digital information.

At least some of the examples or aspects described herein may be implemented using programming stored within appropriate storage circuitry 106 described above and/or communicated through a network or other transmission media and configured to control appropriate processing circuitry. For instance, programming may be provided through appropriate media including, for instance, embodied within articles of manufacture 312, embodied within a data signal, for instance, modulated carrier wave, data packets, digital representations, etc., communicated through an appropriate transmission medium, such as a communication network, for instance, the Internet, a private network, or both, wired electrical connection, optical connection, electromagnetic energy, for instance, through a communications interface, or provided using other appropriate communication structure or medium. For instance, programming including processor-usable code may be communicated as a data signal embodied in a carrier wave.

The storage circuitry 306 may further be in communication with the database 320, which may be created by the processing circuitry 304 to store data pertaining to the media 102, including the bit stream 104 and the mStream 206.

The user interface 308 is configured to interact with a user by, for instance, displaying data for observation by the user, audibly communicating data to a user, etc., as well as receiving inputs from the user, for instance, tactile input, voice instruction, etc. As such, for instance, the user interface 308 may include a display 314, for instance, a cathode ray tube, LCD, etc., configured to depict visual information and a keyboard, mouse, and/or other suitable input device 316 for enabling user-interaction with the media management system 300. In one example, a user may employ the user interface 308 in developing a DE application 120 stored in the storage circuitry 306.

The media input device 310 may be implemented as any suitable device configured to provide electronic media data corresponding to media provided to the media management system 300. The media input device 310 may include, for instance, a scanning device, such as a digital camera, a digital video camera, another media management system, a data storage device, etc.

Figure 4:
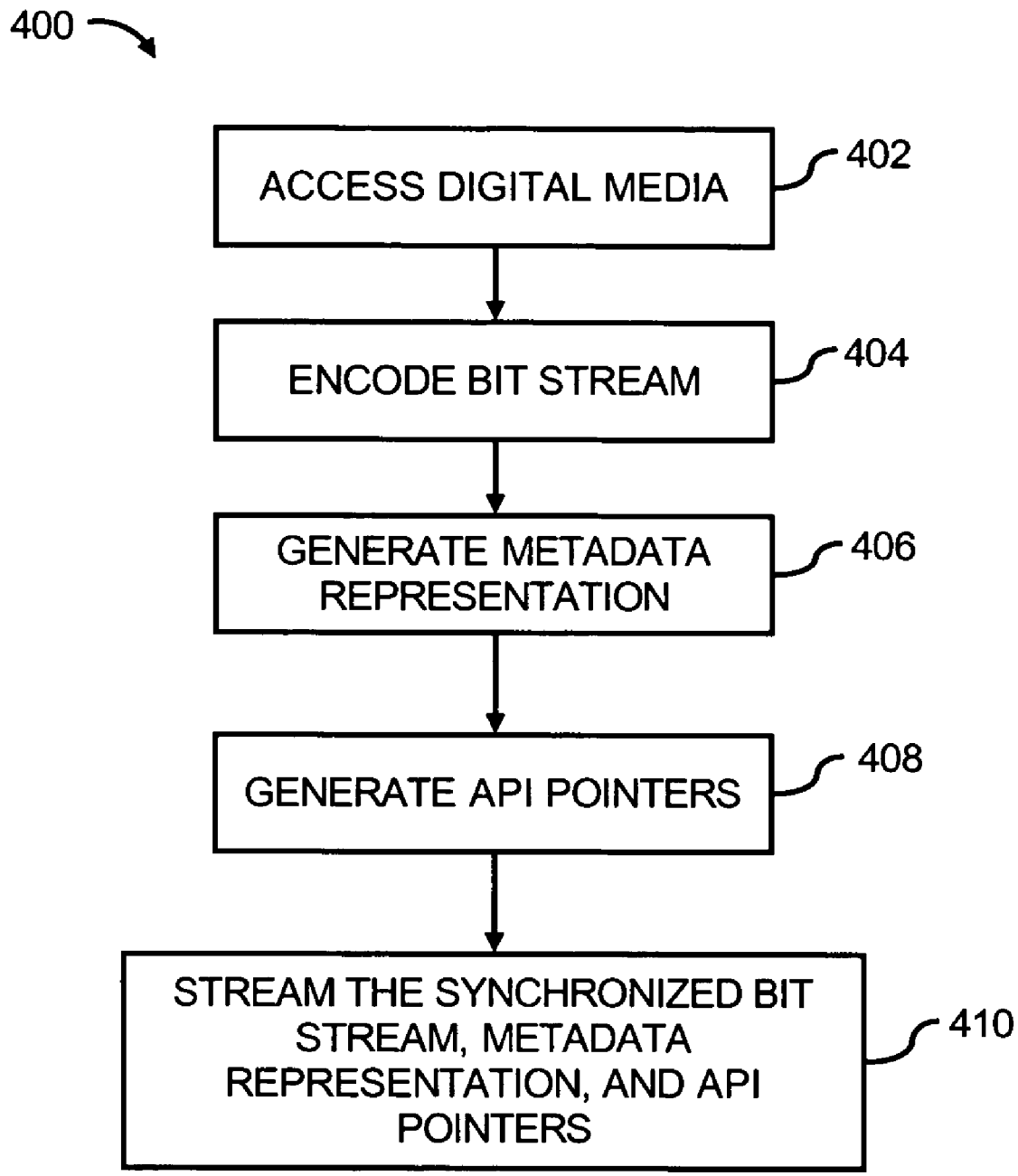
FIG. 4 is a flow diagram of a method of representing a digital media 102, according to an embodiment of the invention.

Turning now to FIG. 4, there is shown a flow diagram of a method 400 of representing a digital media 102, according to an example. The method 400 may be performed using the processing circuitry 404. However, other methods may include more, less and/or alternative steps in other examples.

At step 402, a digital media 102 may be accessed. In other words, for instance, the processing circuitry 304 may access digital media 102 stored in the storage circuitry 306. As another example, the processing circuitry 304 may access digital media 102 received through the media input device 310.

In any regard, at step 404, the processing circuitry 304 may encode a bit stream 104 of the digital media 102. The processing circuitry 304 may invoke the mCodec 204 to encode the bit stream 104 as discussed above. In addition, the coded media bit stream 104 may follow the same coding structure of existing bit streams, such as, mpeg-1, mpeg-2, etc.

At step 406, the processing circuitry 304 may invoke the mCodec 204 to generate a metadata representation of the bit stream 104, which is described herein as the mStream 206. More particularly, for instance, the mStream 206 is generated as a metadata representation that encapsulates information embedded in the bit stream 104 and at least one type of media-related information as discussed above. By way of example, the media-related information may include information known to be useful in or associated with DE applications 120.

At step 408, the processing circuitry 304 may generate pointers to the API's of the mManager 208. As discussed below, implementation of the mManager 208 may generally assures that the bit stream 104 and the mStream 206 are synchronized with each other and that they remain synchronized as changes to the bit stream 104 and the mStream 206 are made.

At step 410, the processing circuitry 304 may enable the streaming or circulation of the synchronized bit stream 104, the mStream 206, and the API pointers to one or more applications 120. Alternatively, however, the mManager 208 may be streamed or circulated instead of the API pointers. The API pointers or the mManager 208 may assure synchronization between the bit stream 104 and the mStream 206 because an application 120 may be unable to access either the bit stream 104 or the mStream 206 without calling the APIs of the mManager 208. As such, the mManager 208 generally prevents the applications 120 from having direct access to either the bit stream 104 or the mStream 206, as discussed below with respect to FIG. 5.

In one example, the one or more applications 120 may be stored in the storage circuitry 306 such that the processing circuitry 304 is configured to invoke the one or more applications 120. In addition, or alternatively, the one or more applications 120 may be stored externally to the media management system 300, in which case, the synchronized bit stream 104 and the mStream 206 may be streamed through the communications interface 302.

Figure 5:
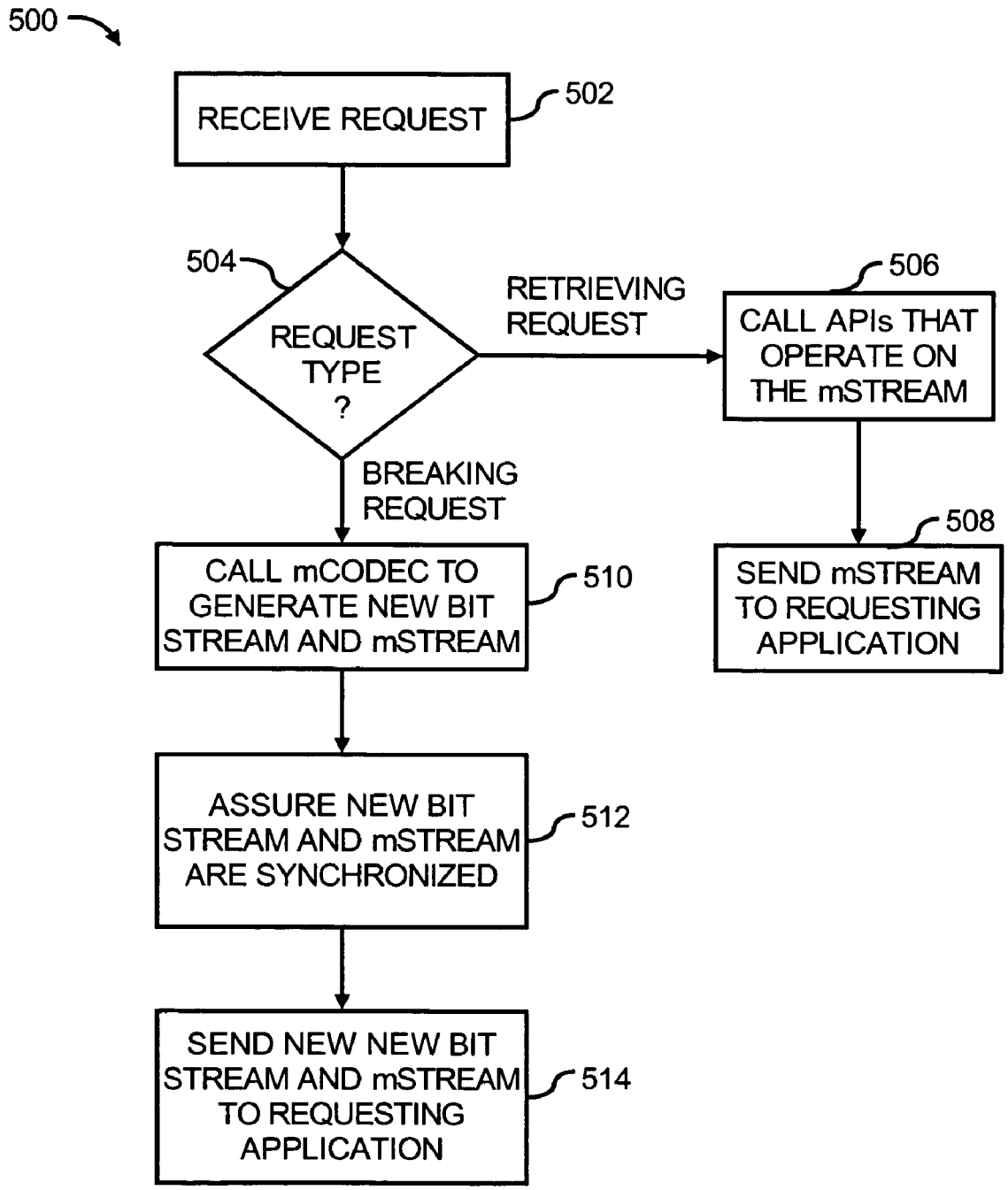
FIG. 5 is a flow diagram of a method of managing media having a bit stream and a metadata representation, according to an embodiment of the invention.

With reference now to FIG. 5, there is shown a flow diagram of a method 500 of managing media having the mWeaver 202 representation, according to an example. The method 500 may be performed using the processing circuitry 304. However, other methods may include more, less and/or alternative steps in other examples.

At step 502, the processing circuitry 304 may receive a request from an application 120 through either the metadata path 114 or the bit stream path 112. The application 120 may be internal or external to the media management system 300 and the request may thus also be originated internally or externally to the media management system 300.

In any regard, at step 504, the processing circuitry 304 may determine the request type. The processing circuitry 304 may, more particularly, determine whether the request is a "retrieving request" or a "breaking request." As described above, a "retrieving request" includes requests that only require retrieval of embedded metadata information from the mStream 206. In this regard, if the processing circuitry 304 determines that the request is a "retrieving request," the processing circuitry 304 may invoke the mManager 208 to call APIs that operate on the mStream 206 and not on the bit stream 104, as indicated at step 506. In addition, the processing circuitry 304 may send the retrieved mStream 206 to the requesting application at step 508.

As also discussed above, a "breaking request" includes requests that require changing of the bit stream 104 and the associated metadata representation, the mStream 206. If the processing circuitry 304 determines that the request is a "breaking request," the processing circuitry 304 may invoke the APIs of the mManager 208 to call the mCodec 204, such that the mCodec 204 generates a new bit stream 104 and a new mStream 206 based upon the new bit stream 104, as indicated at step 510.

At step 512, the processing circuitry 304 may invoke the mManager 208 to generally assure that the new bit stream 104 and the new mStream 206 are synchronized with each other. As such, step 512 is similar to step 408 discussed above. In addition, the processing circuitry 304 may send the new bit stream 104 and the new mStream 206 to the requesting application at step 514.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A computerized system for representing digital media using both a bit stream and an associated metadata, said system comprising:
   a codec configured to encode the digital media to the bit stream, said codec being further configured to generate a metadata representation stream of the bit stream that encapsulates information embedded in the bit stream and at least one type of media-related information; and
   a manager configured to assure synchronization between the bit stream and the metadata representation stream during streaming of the bit stream and the metadata representation stream, wherein the manager comprises a plurality of application program interfaces (APIs) that are called to respond differently to different types of requests received from one or more applications.

2. The system according to claim 1, wherein the manager is configured to call the codec to generate a new bit stream and a new metadata representation stream of the new bit stream in response to receipt of a breaking request from the one or more applications.

3. The system according to claim 1, wherein the digital media comprises digital media configured for execution on one or more digital entertainment applications.

4. The system according to claim 1, wherein the media-related information comprises at least one type of information known to be useful in digital entertainment applications.

5. The system according to claim 4, wherein the media-related information further comprises information embedded in the bit stream.

6. The system according to claim 4, wherein the media-related information further comprises types of information that are known to be relatively frequently accessed and retrieved from the bit stream.

7. The system according to claim 4, wherein the codec is further configured to encapsulate media capture metadata into the metadata representation stream of the bit stream.

8. The system according to claim 4, wherein the media-related information further comprises information that is unrelated to compression/transmission processes.

9. A method of representing digital media, said method comprising:
   accessing the digital media;
   encoding a bit stream from the digital media;
   generating a metadata representation stream that encapsulates information embedded in the bit stream and at least one type of media-related information; and
   implementing a manager to synchronize the bit stream and the metadata representation stream to thereby represent the digital media using coded bit streams and associated metadata representation streams, wherein the manager comprises a plurality of application program interfaces (APIs) that are called to respond differently to different types of requests received from one or more applications.

10. The method according to claim 9, wherein the media-related information comprises information known to be useful in digital entertainment applications, and wherein generating the metadata representation further comprises generating the metadata representation stream to encapsulate at least one type of information known to be useful in digital entertainment applications.

11. The method according to claim 10, wherein the media-related information comprises information known to be relatively frequently accessed and retrieved from the bit stream by the digital entertainment applications, and wherein generating the metadata representation stream further comprises generating the metadata representation stream to encapsulate at least one type of information known to be relatively frequently accessed and retrieved from the bit stream by the digital entertainment applications.

12. The method according to claim 9, further comprising:
    encapsulating media capture metadata into the metadata representation stream.

13. The method according to claim 9, further comprising:
    receiving a request from a digital entertainment application;
    determining the type of the request; and
    calling at least one of the plurality of application program interfaces (APIs) associated with the determined type of request to respond to the request.

14. The method according to claim 13, wherein determining the type of the request further comprises determining whether the request is a breaking request or a retrieving request.

15. The method according to claim 14, wherein calling at least one API further comprises calling at least one API that operates on the metadata representation stream in response to a determination that the request is a retrieving request; and
    wherein responding to the request further comprises sending the metadata representation stream to the digital entertainment application that submitted the request.

16. The method according to claim 14, wherein calling at least one API further comprises calling at least one API that instructs the codec to generate a new bit stream and a new metadata representation stream of the new bit stream in response to a determination that the request is a breaking request; and
    wherein responding to the request further comprises sending the new bit stream and the new metadata representation stream to the digital entertainment application that submitted the request.

17. A computer readable storage medium on which is embedded one or more computer programs, said one or more computer programs implementing a method of representing digital media in digital entertainment applications, said one or more computer programs comprising a set of instructions for:
    accessing the digital media;
    encoding a bit stream from the digital media;
    generating a metadata representation stream that encapsulates information embedded in the bit stream and at least one type of media-related information, wherein the media-related information comprises information known to be useful in digital entertainment applications; and
    implementing a manager to synchronize the bit stream and the metadata representation stream to thereby represent the digital media using coded bit streams and associated metadata representation streams, wherein the manager comprises a plurality of application program interfaces (APIs) that are called to respond differently to different types of requests received from one or more applications.

18. The computer readable medium according to claim 17, said one or more computer programs further comprising a set of instructions for:
    receiving a request from a digital entertainment application;
    determining whether the request is a retrieving request or a breaking request; and sending the metadata representation stream to the digital entertainment application that submitted the request in response to the request comprising a retrieving request.

19. The computer readable medium according to claim 18, said one or more computer programs further comprising a set of instructions for:

encoding a new bit stream in response to the request comprising a breaking request;

generating a new metadata representation stream that encapsulates information embedded in the new bit stream and at least one type of media-related information; and sending the new bit stream and the new metadata representation stream to the digital entertainment application that submitted the request.

\* \* \* \* \*